US006952078B1

(12) United States Patent
Guenther

(10) Patent No.: US 6,952,078 B1
(45) Date of Patent: Oct. 4, 2005

(54) ENCAPSULATION FOR ORGANIC LED DEVICE

(75) Inventor: Ewald Karl Michael Guenther, Regenstaut (DE)

(73) Assignee: Osram Opto Semiconductord GmbH, Regensburg (DE)

( * ) Notice: Subject to any disclaimer, the term of this patent is extended or adjusted under 35 U.S.C. 154(b) by 0 days.

(21) Appl. No.: 10/168,271

(22) PCT Filed: Dec. 17, 1999

(86) PCT No.: PCT/SG99/00145

§ 371 (c)(1), (2), (4) Date: Oct. 15, 2002

(87) PCT Pub. No.: WO01/44865

PCT Pub. Date: Jun. 21, 2001

(51) Int. Cl.[7] .............................................. H05B 33/00
(52) U.S. Cl. ......................... 313/506; 445/24; 313/512
(58) Field of Search ................................ 313/506, 512, 313/495, 511; 445/58, 24, 25; 427/469; 430/313

(56) References Cited

U.S. PATENT DOCUMENTS

| 4,640,584 A | | 2/1987 | Tsubakimoto |
| 4,961,962 A | * | 10/1990 | Morimoto .................... 427/180 |
| 5,385,499 A | * | 1/1995 | Ogawa et al. ................. 445/24 |
| 5,550,408 A | | 8/1996 | Kunitomo et al. |
| 5,552,913 A | | 9/1996 | Shimizu et al. |
| 5,580,619 A | | 12/1996 | Sakai et al. |
| 5,632,663 A | | 5/1997 | Ishihara et al. |
| 5,724,230 A | | 3/1998 | Poetzinger |
| 5,750,258 A | * | 5/1998 | Sakai et al. .................. 428/405 |
| 5,777,386 A | | 7/1998 | Higashi et al. |
| 5,804,917 A | | 9/1998 | Takahashi et al. |
| 5,821,692 A | | 10/1998 | Rogers et al. |
| 5,844,315 A | | 12/1998 | Melton et al. |
| 5,900,675 A | | 5/1999 | Appelt et al. |
| 5,939,783 A | | 8/1999 | Laine et al. |
| 6,111,355 A | * | 8/2000 | Inoue et al. ................. 313/506 |
| 6,172,879 B1 | | 1/2001 | Cilia et al. |
| 6,177,729 B1 | | 1/2001 | Benenati et al. |
| 6,232,667 B1 | | 5/2001 | Hultmark et al. |
| 6,259,204 B1 | | 7/2001 | Ebisawa et al. |
| 6,260,264 B1 | | 7/2001 | Chen et al. |
| 6,313,528 B1 | | 11/2001 | Solberg |
| 6,339,254 B1 | | 1/2002 | Venkateshwaran et al. |
| 6,376,917 B1 | | 4/2002 | Takeshita et al. |
| 6,633,124 B2 | * | 10/2003 | Himeshima et al. ......... 313/506 |
| 6,649,221 B1 | * | 11/2003 | Tateno et al. ................ 427/469 |
| 2003/0094691 A1 | * | 5/2003 | Auch et al. .................. 257/704 |

FOREIGN PATENT DOCUMENTS

| EP | 0884792 | 12/1998 |
| EP | 0910228 | 4/1999 |
| EP | 1021070 | 7/2000 |
| JP | 58160927 A | 9/1983 |
| JP | 0490512 A | 3/1992 |
| JP | 04136916 A | 5/1992 |
| JP | 11176571 | 7/1999 |
| WO | WO 01/04938 A1 | 1/2001 |
| WO | WO 01/04963 A1 | 1/2001 |
| WO | WO01/39174 | 5/2001 |
| WO | WO01/44865 | 6/2001 |
| WO | WO01/45140 | 6/2001 |

OTHER PUBLICATIONS

U.S. Appl. No. 10/168,058, Guenther et al.*
Burroughs et al., "Light–emitting diodes based on conjugated polymers", Nature, London, 1990, vol, 347, 539–541.

* cited by examiner

Primary Examiner—Joseph Williams
(74) Attorney, Agent, or Firm—Fish & Richardson P.C.

(57) ABSTRACT

An encapsulation for a device is disclosed. In one embodiment, spacer particles (270) are selectively located in the device region. The spacer particles (270) prevent a cap mounted on the substrate (460) from contacting the active components, thereby protecting them from being damaged.

34 Claims, 14 Drawing Sheets

ENCAPSULATION FOR ORGANIC LED DEVICE

This application is a 371 of PCT/SG99/00145, filed Dec. 17, 1999.

FIELD OF THE INVENTION

The present invention relates to organic LED (OLED) devices. More particularly, the invention relates to packaging of OLED devices.

BACKGROUND OF THE INVENTION

FIG. 1 shows an OLED device 100. The OLED device comprises one or more organic functional layers 110 between first and second electrodes 105 and 115. The electrodes can be patterned to form, for example, a plurality of OLED cells to create a pixelated OLED device. Bond pads 150, which are coupled to the first and second electrodes, are provided to enable electrical connections to the OLED cells.

To protect the OLED cells from the environment such as moisture and/or air, a cap 160 encapsulates the device. The active and electrode materials of the OLED cells are sensitive and can be easily damaged due to mechanical contact with, for example, the cap. To prevent damage to the OLED cells, a cavity cap or package is used. The cavity package provides a cavity 145 between the cap and OLED cells. The cavity also allows for the placement of desiccant materials to cope with finite leakage rate of the device.

The lateral dimensions of OLED devices are usually in the range of a few centimeters or more, depending on the applications. To accommodate the relatively large lateral dimensions, thicker caps are used to provide the necessary mechanical stability to maintain the integrity of the cavity. However, the demand for thin and flexible devices requires the use of thinner components, such as the cap and the substrate. Decreasing the thickness of the cap reduces its mechanical stability, making it more prone to bending which can cause the cavity to collapse, thereby damaging the OLED cells.

As evidenced from the above discussion, it is desirable to provide an OLED device having improved packaging, particularly those formed on thin or flexible substrates.

SUMMARY OF THE INVENTION

The invention relates to improved encapsulation for devices. In one embodiment, an improved encapsulation is provided for an OLED device. The OLED device includes OLED cells formed in the device region of a substrate. Spacer particles are selectively located in the device region to provide support for a cap mounted on the substrate. The spacer particles are selectively located, for example, in the inactive or non-emissive regions between the OLED cells. The use of spacer particles prevents the cap from contacting the OLED cells in the cell region due to stress induced by bending, improving reliability.

PREFERRED EMBODIMENTS OF THE INVENTION

The invention relates generally to OLED devices. In particular, the invention provides a cost-effective package for encapsulating OLED devices, particularly those formed on thin substrates. In accordance with the invention, spacer particles are located in the device or cell region of the device. The spacer particles support the cap, preventing it from contacting the OLED cells. The use of spacer particles in OLEDs is described in concurrently filed international patent application titled "Encapsulation For Organic LED Device", which is herein incorporated by reference for all purposes.

The spacer particles are spatially distributed on, for example, a substrate with the desired pattern. In one embodiment, the spacer particles are spatially located in the non-emissive or non-active areas of the device region in which OLED cells are formed. The spacer particle pattern distribution can be formed from a direct or indirect patterning process.

Figure 1:
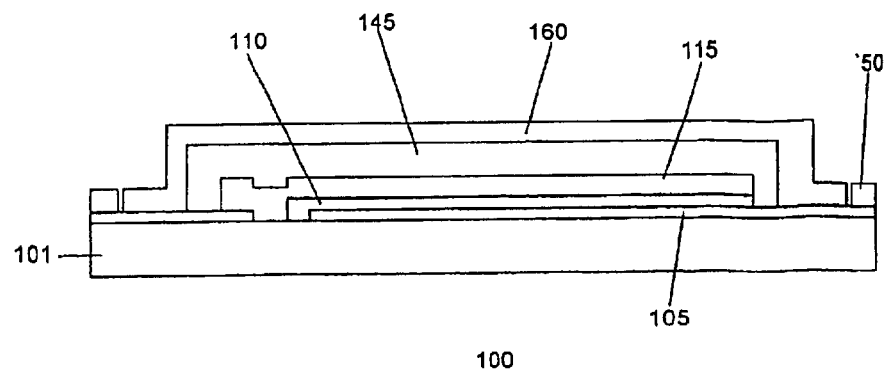
FIG. 1 shows an OLED device.
Figure 2:
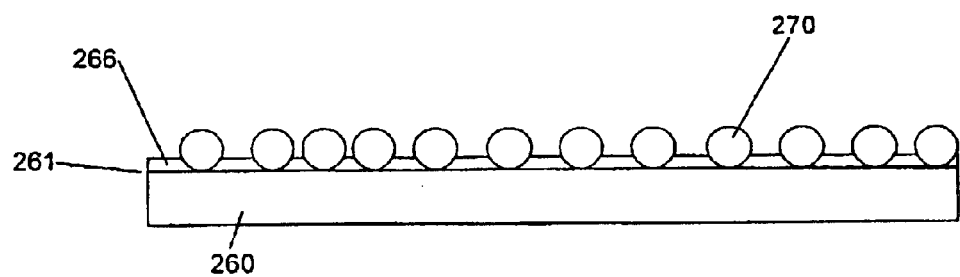
FIGS. 2–6 show a process for forming an OLED device in accordance with one embodiment of the invention.

FIGS. 2–6 show a process for fabricating an OLED device in accordance with one embodiment of the invention. Referring to FIG. 2, a substrate 260 is provided. The substrate, in one embodiment, serves as a cap for encapsulating the OLED device. The cap comprises, for example, metal or glass. Other types of materials which can protect the active components from the environment, such as ceramic or metallized foil, are also useful. The thickness of the cap can be, for example, 10–200 um.

In accordance with the invention, spacer particles 270 are randomly distributed on the substrate surface 261. The spacer particles are randomly deposited on the substrate surface by depositing a device layer having spacer particles suspended therein. In on embodiment, the device layer comprises a photosensitive material, such as photoresist. Various types of photoresists can be employed, for example, AZ 5214E from Clariant or TSMR 8900 from Tokyo Oka. Other photosensitive materials in which spacer particles can be suspended, such as photopatternable polyimide, photopatternable polybenzoxazole, photopatternable polyglutarimide and other resins, are also useful. Suspending spacer particles in a photosensitive material advantageously enables the formation of the spacer particle distribution on the substrate by a direct patterning process.

The shape of the spacer particles can be spherical with a diameter substantially equal to about the desired height of the cavity created by the cap. The cavity for OLED devices typically is about 2–500 um. Spacer particles having other geometric shapes, such as cubical, prism, pyramidal, or other regular or irregular shapes, with an average mean diameter sufficient to maintain the desired height of the cavity can also be used. The size distribution of the spacer particles should be sufficiently narrow to ensure proper separation between the cap and OLED cells.

The spacer particles preferably comprise a non-conductive material. In one embodiment, the spacer particles are made of glass. Spacer particles made of other types of non-conductive (e.g., silica, polymers, or ceramic) or conductive materials are also useful. The use of spacer particles comprising conductive materials is also useful.

The concentration of spacer particles in the photoresist should be sufficient to produce a desired spacer particle density in the final pattern distribution. In one embodiment, the concentration of spacer particles should be sufficient to produce a spacer particle density in the pattern distribution to prevent the cap from contacting the OLED cells. In one embodiment, the photoresist comprises a spacer particle concentration of about 0.1–2% (by weight). Such a concentration produces a spacer particle density in which the average distance between the spacer particles is about 10–500 $\mu$m. Typically, this is sufficient in preventing the cap from contacting the OLED cells. The concentration of spacer particles can be varied to accommodate design requirements, such as the thickness of the 2 caps, thickness of the substrate and amount of device flexibility needed.

The photoresist is deposited (e.g., spin-on techniques) on the substrate surface, forming a resist layer 266 with spacer particles 270 embedded therein. The thickness of the resist layer should be less than the diameter of the spacer particles. Typically, the resist layer is about 100–2000 nm thick.

Figure 3:
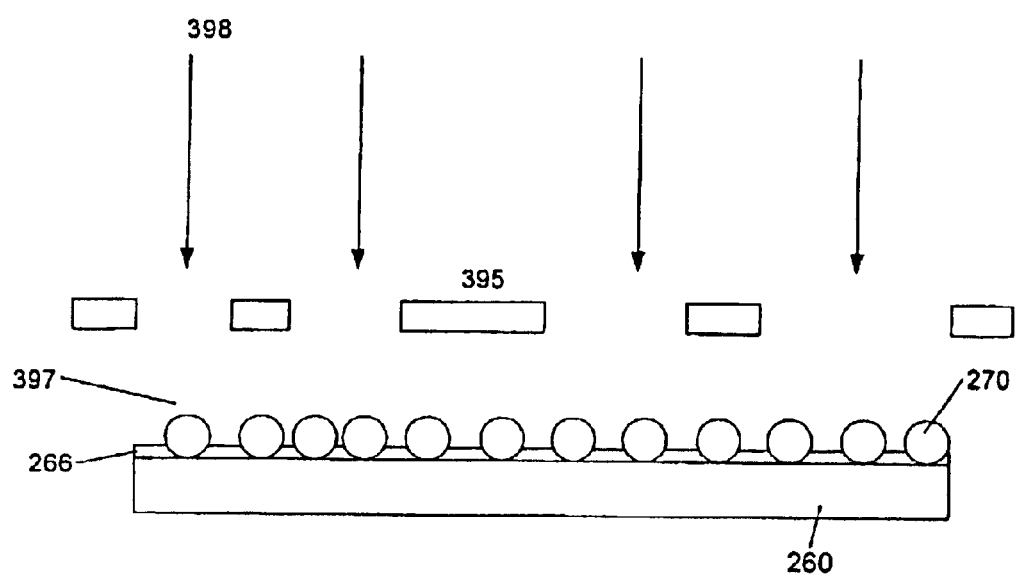

Referring to FIG. 3, radiation 398 from an appropriate exposure source (ultra-violet, deep ultra-violet, x-ray electron beam, or ion beam, depending on the resolution and resist) passes through a mask 395 to selectively expose regions 397 of the resist layer 260.

Figure 4:
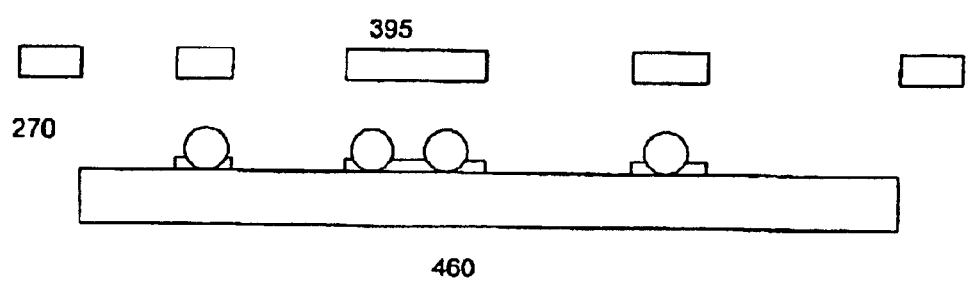

In FIG. 4, the resist is appropriately developed (e.g., wet chemicals) to remove the exposed portions. Both the resist and spacer particles in the exposed portions are removed, leaving the desired spacer particle distribution pattern on the surface of the cap. As described, the resist is a positive resist. The use of negative resist is also useful.

In an alternative embodiment, the spacer particle distribution pattern is created using an indirect patterning process. The device layer in which the spacer particles are suspended comprises a non-photopatternable material, such as novolac solution, benzocyclobutene solution, polyimidesolution, polybenzoxazole solution, polyglutarimide solution and other acrylic or epoxy resins. Other non-photopatternable materials in which the spacer particles can be suspended is also useful. The device layer is deposited on the substrate by, for example, spin-coating or other wet coating processes such as doctor blading. Wet printing techniques can also be used to deposit the spacer particles on the substrate surface. A resist layer is deposited over the spacer particles and patterned to remove portions of the resist. The remaining resist serves as an etch mask, for example, a wet etch process, to remove unwanted spacer particles and portions of the device layer from the cap surface. The use of other types of photopatternable materials to form the etch mask is also useful.

Figure 5:
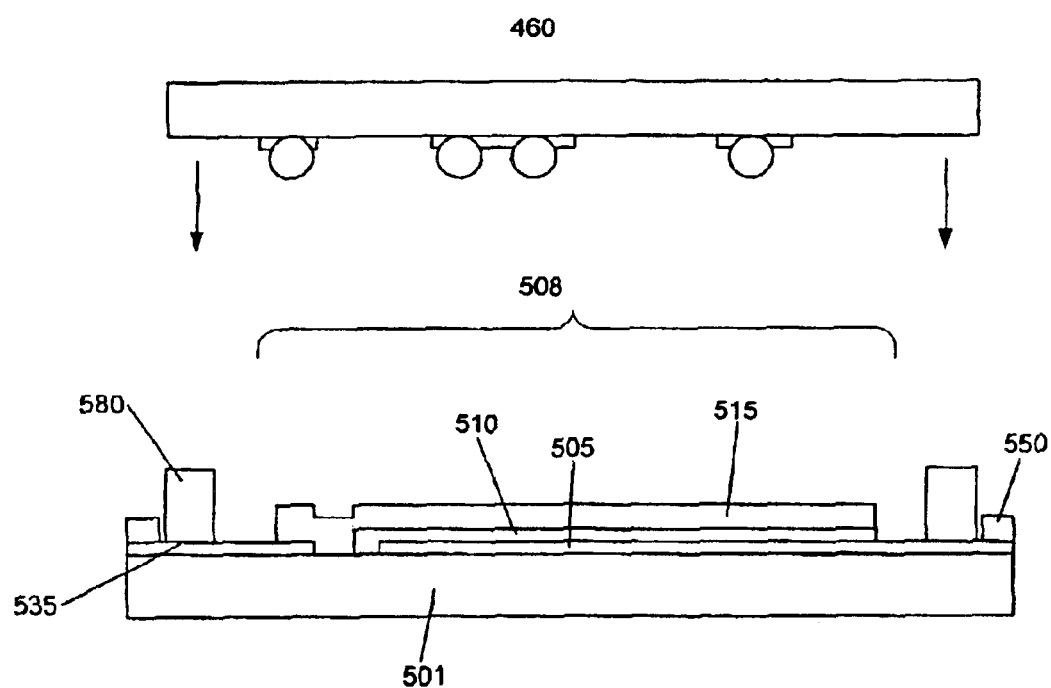

Referring to FIG. 5, a thin substrate 501 is prepared with active components. The substrate comprises, for example, a plastic film such as, for example, transparent poly(ethylene terephthalate) (PET), poly(butylene terephthalate) (PBT), poly(enthylene naphthalate) (PEN), Polycarbonate (PC), Polyimides (PI), Polysulfones (PSO), and poly(p-phenylene ether sulfone) (PES). Other materials such as Polyethylene (PE), Polypropylene (PP), poly(vinyl chloride) (PVC), Polystyrene (PS) and Poly(methyl methyleacrylate) (PMMA), can also be used to form the substrate. A substrate comprising glass or other transparent materials such as quartz is also useful. Other materials can also be used to form the substrate, depending on the application.

In one embodiment, the substrate is about 20–300 um thick. In some cases, the thin substrate maybe mechanically unstable, creating processing problems. A temporary support layer (not shown) can be employed to stabilize the substrate during the fabrication process. In one embodiment, the substrate is prepared with OLED cells. The temporary support layers, for example, can be provided on the backside of the substrate. In one embodiment, the temporary support layer comprises a polymer foil coated with an adhesive. After processing, the temporary layers are removed since the device package can be used to mechanically stabilize the device.

The OLED cells are formed in the cell region 508 of the substrate. The OLED cells comprise a stack of layers which includes first and second electrodes 505 and 515 with at least one organic functional layer 510 therebetween. Fabrication of OLED cells is described in, for example, Burroughes et al., Nature (London) 347, 539 (1990) which is herein incorporated by reference for all purposes. Bond pads 550 are provided to provide access to the OLED cells.

Typically, the fabrication of the OLED cells includes depositing a first electrode layer 505 on the substrate. The first electrode layer comprises, for example, a transparent conductive layer such as indium-tin-oxide. Other transparent conductive materials are also useful. The first electrode layer is patterned using conventional etch and mask techniques. Patterning techniques using a stamp are also useful. Such techniques are described in co-pending international patent application titled "Mechanical Patterning of a Device Layer", which is herein incorporated by reference for all purposes. The pattern of the electrode layer depends on the application. For example, the first electrode layer can be patterned to form lower electrode strips which serve as anodes of a pixelated device. Connections to bond pads can also be formed.

One or more organic functional layers 510 are formed on the substrate, covering the first electrodes. The functional organic layers comprise, for example, conjugated polymer or low molecular materials such as $Alq_3$. Other types of functional organic layers are also useful. The organic functional layers can be formed by conventional techniques. Such techniques include, for example, wet processes such as spin coating or vacuum sublimation (for Alq3 organic layers). Portions of the organic functional layers can be selectively removed to expose, for example, the bond pad connections. Selective removal of the organic layers can be achieved using, for example, polishing. Other techniques for selective removal of the organic layers, such as etching, scratching, or laser ablation, can also be used.

A second electrode layer 515 is deposited on the substrate over the organic functional layers and patterned. In one embodiment, the second electrode layer is patterned to form second electrode strips which intersect with the first electrode strips to create a pixelelated OLED device. Spatially depositing the conductive layer to form second electrodes is also useful. Other techniques for forming OLED cells are also useful.

In one embodiment, a sealing frame 535 surrounding the cell region is prepared. Preparation of the sealing frame includes patterning the substrate, if necessary, to form an area for forming a sealing post 580 therein. The height of the sealing post is sufficient to form a cavity with the desired height.

The sealing post, for example, comprises an adhesive for permanently sealing the cap to the device. Adhesives such as uv or thermal curable epoxy, acrylates, hot melt adhesives, or low melt inorganic materials (e.g., solder glass) can be used. Spacer particles (not shown) can be provided in the sealing post. The spacer particles can be provided in the sealing post to support the cap during the uncured phase of the adhesive in the sealing post. The sealing post is formed using conventional techniques which include, for example, screen-printing, dispensing, or photolithography.

The sealing posts can be formed with other types of materials such as those described in co-pending international patent application titled "Encapsulation Of A Device", which is herein incorporated by reference for all purposes. Preferably, the sealing post comprises a photopatternable or photosensitive material that can be directly patterned. Photopatternable materials include, for example, photosensitive polyimide, photosensitive polybenzoxazole, photoresists, photoresists based on novolac systems, and dry film resist materials. Photoresists based on novolac systems are particularly useful since they can be cured and crosslinked to provide improved mechanical integrity over other types of non-curable resists. Indirectly patternable materials, for example, spin-on glass materials, polyimide, polybenzoxazole, polyglutarimide, benzocyclobutene, polymers such as polyethylene (PE), polystyrene (PS), polypropylene (PP), inorganic materials such as $SiO_2$, $Si_3N_4$, and $AL_2O_3$, or ceramics, are also useful.

In such applications, adhesives can be provided on the sealing posts to seal the cap. Adhesives such as self-hardening adhesives, UV or thermal curable adhesives, or hot melt adhesives are useful. Other techniques, such as those employing low temperature solder materials, ultrasonic bonding, or welding techniques using inductance or laser welding, are also useful.

In alternative embodiments, the sealing post is formed on the inner surface of the cap instead of on the sealing frame.

Figure 6:
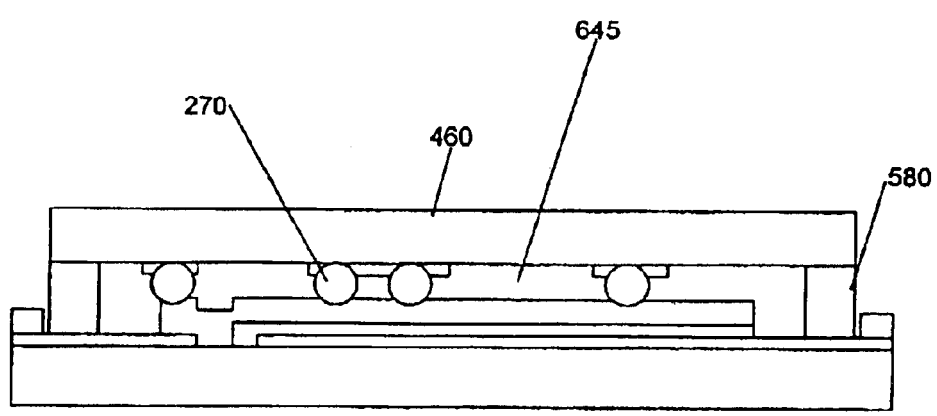

Referring to FIG. 6, the cap is mounted on the substrate. The sealing post seals the cap, encapsulating the device. The cap forms a cavity 645, supported by spacer particles 270. The spacer particles provide support for the cap to prevent it from contacting the OLED cells in the cell region, enabling the use of thinner substrate and cap.

Figure 7:
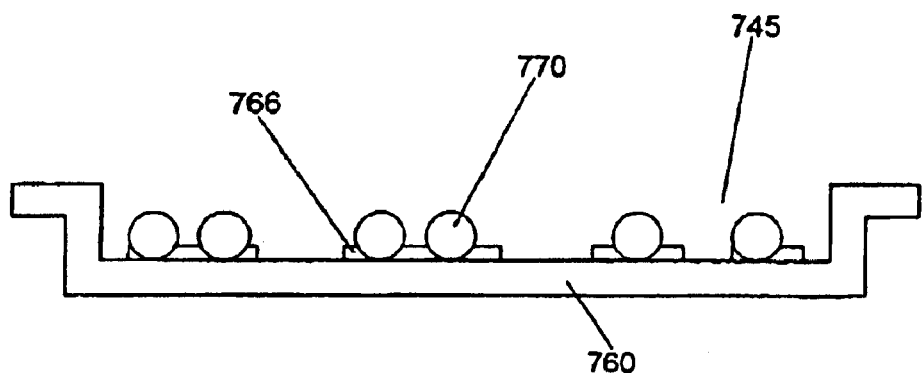
FIGS. 7–8 show a process for forming an OLED device in accordance with another embodiment of the invention.
Figure 8:
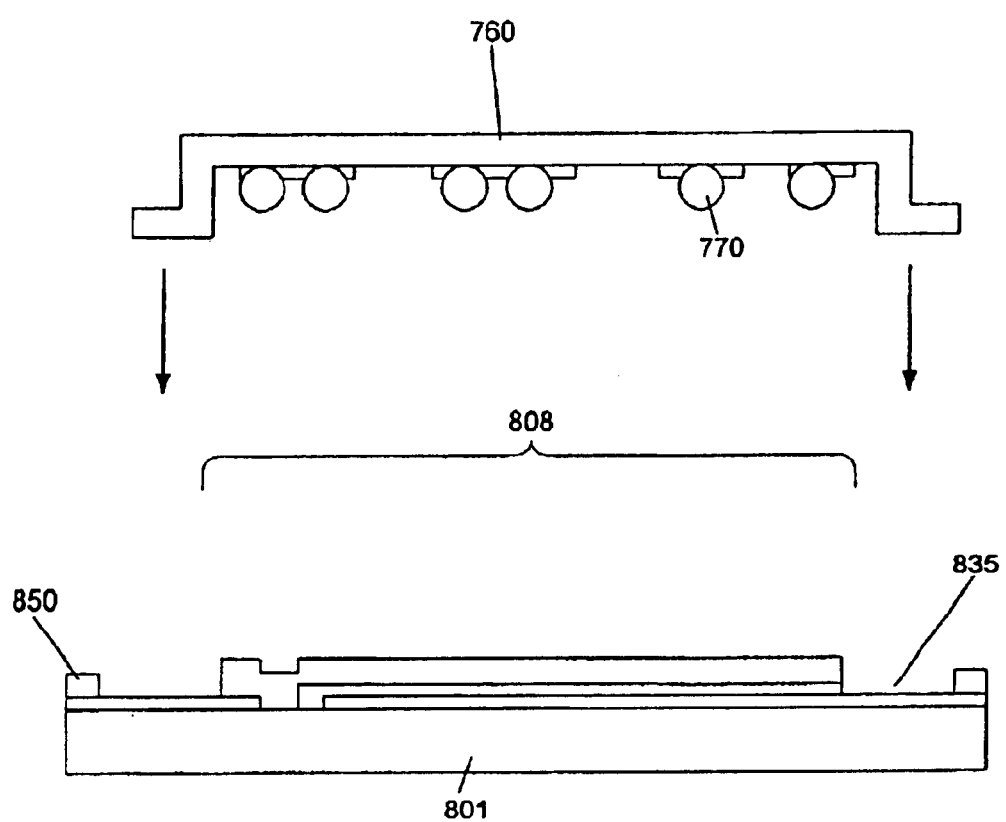
Figure 9:
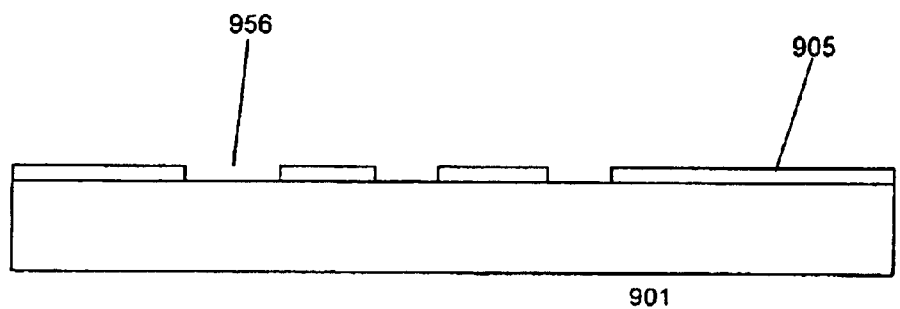
FIGS. 9–13 show a process for forming an OLED device in accordance with another embodiment of the invention.

FIGS. 7–8 show an another embodiment of the invention. A cap 760 preformed with a cavity 745 is shown. The inner surface of the cap comprises spacer particles 770. The spacer particles comprise a distribution pattern created by a directly or an indirectly patternable process in accordance with the invention. In embodiment, the spacer particle distribution corresponds to the non-active areas of the OLED device.

Referring to FIG. 8, a substrate 801 is prepared with OLED cells in the cell region 808. The OLED cells comprises at least one functional organic layer 810 sandwiched between first and second electrodes 805 and 815. The electrodes can be patterned to form a pixelated OLED device. Bond pads 850 are provided to access the OLED cells. The cap 760 with the spacer particles is mounted in the cap sealing frame region 835 of the substrate to encapsulate the device. Adhesives such as self-hardening adhesives, UV or thermal curable adhesives, or hot melt adhesives are useful to mount the cap. Other techniques, such as those employing low temperature solder materials, ultrasonic bonding, or welding techniques using inductance or laser welding, are also useful for mounting the cap. The spacer particles provide support for the cap to prevent it from contacting the OLED cells in the cell region, enabling the use of thinner substrate and cap.

FIGS. 9–13 show a process for forming OLED device in accordance with another embodiment of the invention. As shown, a substrate 901 is provided. The substrate serves as a support for OLED cells. The substrate comprises, for example, glass or polymer. Other materials are also useful. A conductive layer 905 is formed on the surface on the substrate. The conductive layer serves as an electrode for OLED cells. In one embodiment, the first electrode layer comprises, for example, a transparent conductive layer such as ITO. Other transparent conductive materials are also useful.

The conductive layer is patterned as desired to selectively remove portions of the layer, exposing portions 956 of the substrate. In one embodiment, the conductive layer is patterned to form strips that serve as, for example, the anode of a pixelated OLED device. The patterning process can also form connections for bond pads. Conventional techniques, such as photolithography and etching, can be used to pattern the conductive layer. Patterning techniques using a stamp are also useful. Such techniques are described in co-pending international patent application titled "Mechanical Patterning of a Device Layer", which is herein incorporated by reference for all purposes.

Figure 10:
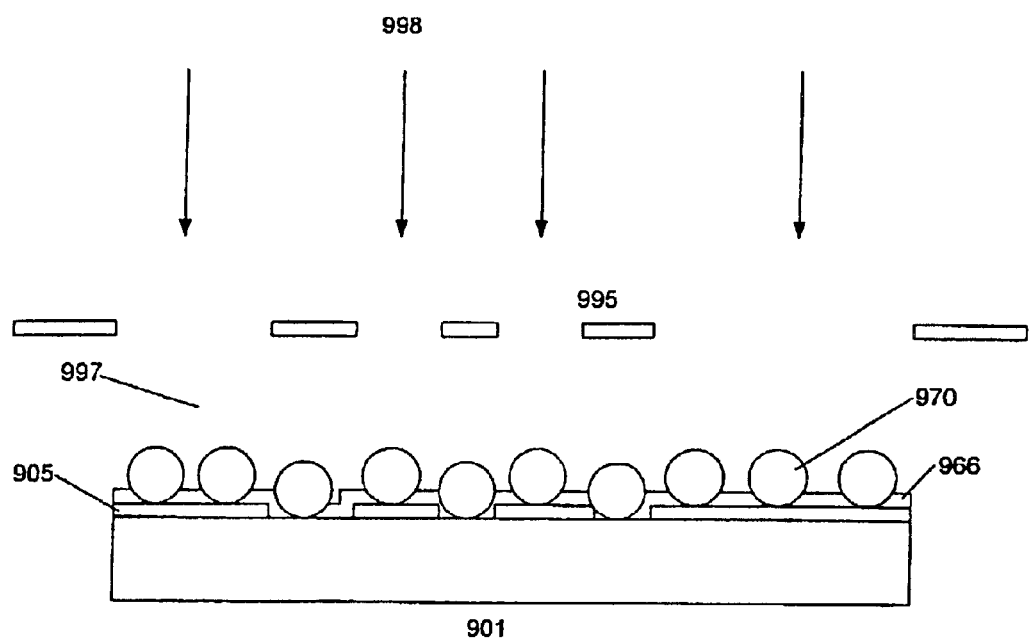

Referring to FIG. 10, a resist layer 966 with spacer particles suspended therein is deposited on the substrate in accordance with one embodiment of the invention. Radiation 998 from an exposure source is directed though a mask 995 to selectively expose portions 997 of the resist.

Figure 11:
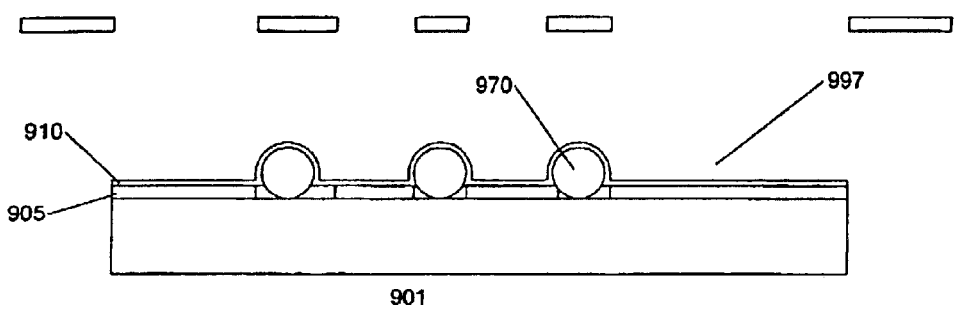

In FIG. 11, the resist layer 966 is developed removing the exposed or unexposed portions, depending on whether a positive or negative resist is used. The spacer particles are removed along with the resist layer, creating a spacer particle distribution pattern. Alternatively, the spacer particle distribution pattern can be formed by indirectly patternable processes in accordance with the invention.

One or more functional organic layers 910 are deposited on the substrate, covering the exposed substrate portions and the conductive layer. The functional organic layers comprise, for example, conjugated polymer on $Alq_3$. Other types of functional organic layers are also useful.

Figure 12:
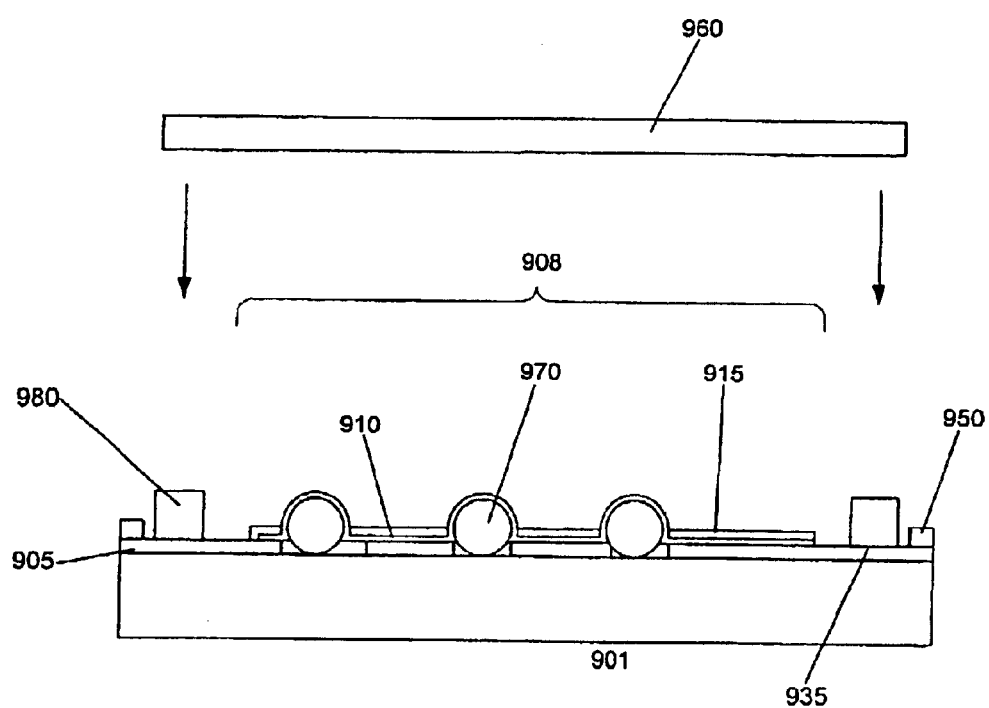

Referring to FIG. 12, portions of the organic layers can be selectively removed, for example, to expose underlying layer for bond pad connections. Selective removal of the organic layers can be achieved using polishing. Other techniques, such as etching, scratching, or laser ablation, can also be used to selectively remove portions of the organic layers.

A second conductive layer 915 is deposited on the substrate, covering the spacer particles and other layers formed thereon. The conductive layer comprises, for example, Ca, Mg, Ba, Ag, Al or a mixture or alloy thereof. Other conductive materials, particularly those which comprises a low work function, can also be used to form the second conductive layer. In one embodiment, the second conductive layer is patterned to form electrode strips that serve as cathode for a pixelated OLED device. Also, connections for bond pads can be formed during the patterning process. Alternatively, the conductive layer can be selectively deposited to form cathode strips and bond pad connections. Selective deposition of the conductive layer can be achieved with, for example, mask layers. The cathode strips are typically orthogonal to the anode strips. Forming cathode strips that are diagonal to the anode strips is also useful. The intersections of the top and bottom electrode strips form organic LED pixels.

A sealing post 980 is formed in a sealing frame region 935. The sealing post serves to support and permanently seal the cap onto the device. Forming the sealing post on the inner surface of the cap instead of on the sealing frame is also useful.

Figure 13:
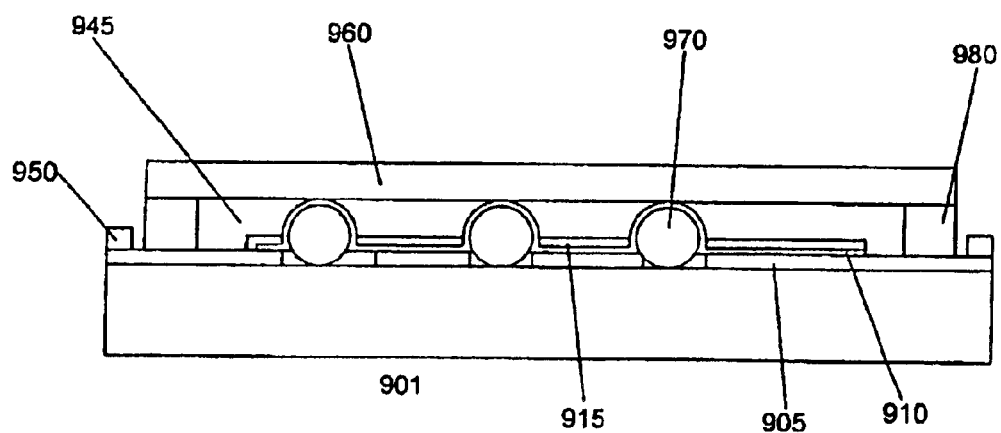

Referring to FIG. 13, the cap 960 is mounted on the substrate. The sealing post seals the cap, encapsulating the device. The cap forms a cavity 945, supported by spacer particles 270. The spacer particles provide support for the cap to prevent it from contacting the OLED cells in the cell region, enabling the use of thinner substrate and cap.

Figure 14:
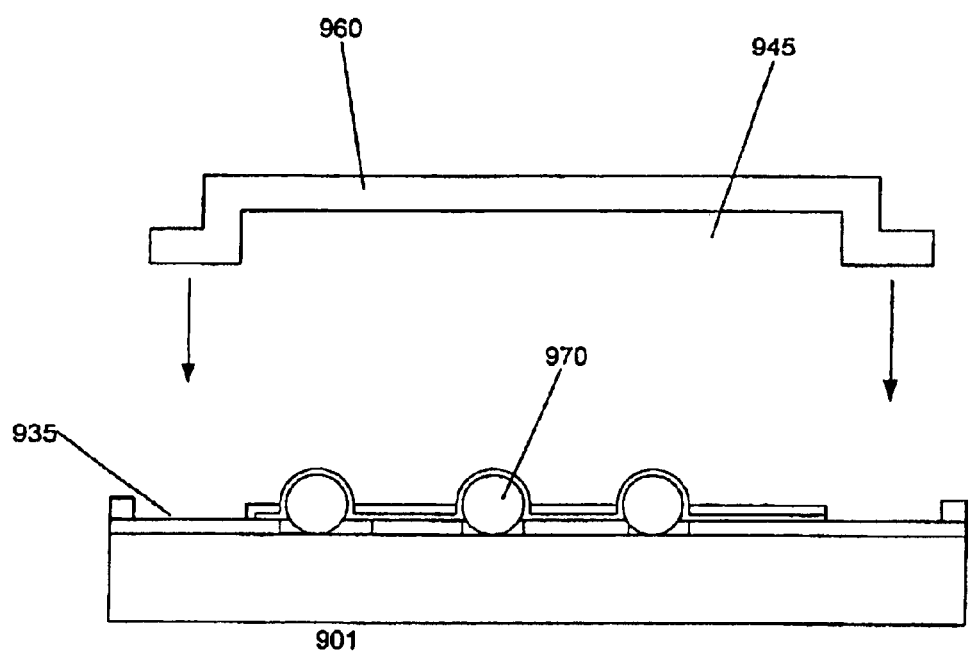
FIG. 14 shows a process for forming an OLED device in accordance with another embodiment of the invention.

Referring to FIG. 14, an alternative embodiment of the invention is shown. A cap 960 preformed with a cavity 945 is shown. The cap is mounted in a sealing frame region of the substrate prepared with active components and spacer particles to encapsulate the device. Adhesives such as self-hardening adhesives, UV or thermal curable adhesives, or hot melt adhesives are useful to mount the cap. Other techniques, such as those employing low temperature solder materials, ultrasonic bonding, or welding techniques using inductance or laser welding, are also useful for mounting the cap. The spacer particles provide support for the cap to prevent it from contacting the OLED cells in the cell region, enabling the use of thinner substrate and cap.

Spacer particles can also be useful in providing support in other types of devices that employ cavity packages. Such devices include, for example, electrical devices, mechanical devices, electromechanical devices, or microelectromechanical systems (MEMS).

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
   a substrate with a device region;
   a cap for encapsulating the device, the cap creating a cavity over the device region; and
   spacer particles selectively located in the device region to support the cap, wherein the spacer particles are distributed in a resist.

2. The device of claim 1 wherein the device region comprises OLED cells.

3. The device of claim 2 wherein the spacer particles are selectively located in non-active areas of the device region.

4. The device of claim 3 wherein the spacer particles comprise a non-conductive material.

5. The device of claim 1 wherein the spacer particles are selectively located in non-active areas of the device region.

6. The device of claim 5 wherein the spacer particles comprise a non-conductive material.

7. The device of claim 1 or 2, further comprising a device layer used for depositing the spacer particles in the device region.

8. The device of claim 7 wherein the device layer comprises a photosensitive material.

9. The device of claim 8 wherein the spacer particles comprise a mean diameter to maintain a height of the cavity between the cap and substrate.

10. A device comprising:
    a substrate with a device region;
    a cap for encapsulating the device, the cap creating a cavity over the device region;
    spacer particles selectively located in the device region to support the cap; and
    a device layer used for depositing the spacer particles in the device region;
    wherein the device layer comprises a non-photosensitive material.

11. The device of claim 10 wherein the spacer particles comprise a mean diameter to maintain a height of the cavity between the cap and substrate.

12. A method for forming a device comprising:
    suspending spacer particles in a material;
    coating the material with the spacer particles on an inner surface of a cap;
    selectively removing the material with the spacer particles from the inner surface of the cap, wherein the selective removal leaves at least a portion of the material and a portion of the spacer particles on the inner surface of the cap;
    providing a substrate with a device region; and
    mounting the cap on the substrate to encapsulate the device region, the cap supported by the spacer particles and forming a cavity in the device region.

13. The method of claim 12 wherein the device comprises an OLED device with OLED cells in the device region.

14. The method of claim 13 wherein the spacer particles comprise a non-conductive material.

15. The method of claim 12 wherein the spacer particles comprise a non-conductive material.

16. The method of claim 12 wherein the material comprises a photosensitive material.

17. The method of claim 12 wherein selectively removing the material with the spacer particles comprises:
    exposing the photosensitive material with an exposure source through a pattern mask; and
    developing the photosensitive material to selectively remove portions of the photosensitive material along with the spacer particles thereon.

18. The method of claim 17 wherein the spacer particles comprise a mean diameter to maintain a height of the cavity between the cap and substrate.

19. The method of claim 18 wherein the spacer particles are deposited on the substrate with a density to maintain the cavity.

20. The method of claim 17 wherein the spacer particles are deposited on the substrate with a density to maintain the cavity.

21. A method for forming a device, comprising:
    suspending spacer particles in a material, wherein the material comprises a non-photosensitive material;
    coating the material with spacer particles on an inner surface of the cap;
    selectively removing the material with the spacer particles from the inner surface;
    providing a substrate with a device region;
    mounting the cap on the substrate to encapsulate the device region, the cap supported by the spacer particles and forming a cavity in the device region.

22. The method of claim 21 wherein selectively removing the material with the spacer particles comprises:
    depositing a photosensitive material on the substrate, covering the material with the spacer particles;
    exposing the photosensitive material with an exposure source through a pattern mask;
    developing the photosensitive material to selectively remove portions of the photosensitive material, leaving remaining portions;
    removing the material and spacer particles unprotected by the remaining portions of the photosensitive material; and
    removing the remaining portions of the photosensitive material, leaving spacer particles selectively located on the inner surface.

23. The method of claim 22 wherein the spacer particles comprise a mean diameter to maintain a height of the cavity between the cap and substrate.

24. The method of claim 23 wherein the spacer particles are deposited on the substrate with a density to maintain the cavity.

25. The method of claim 22 wherein the spacer particles are deposited on the substrate with a density to maintain the cavity.

26. The device of claim 1, wherein:

the spacer particles are adhered to the substrate.

27. The device of claim 1, wherein:

the spacer particles are adhered to the cap.

28. A method for forming a device, comprising:

suspending spacer particles in a material;

coating the material with spacer particles on a substrate;

selectively removing the material with the spacer particles from the substrate, wherein the selective removal leaves at least a portion of the material and a portion of the spacer particles on the substrate;

forming a device region on the substrate;

mounting a cap on the substrate to encapsulate the device region, the cap supported by the spacer particles and forming a cavity in the device region.

29. The method of claim 28, wherein the spacer particles comprise a non-conductive material.

30. The method of claim 28, wherein the material comprises a photosensitive material.

31. The method of claim 30, wherein selectively removing the spacer particles comprises:

exposing the photosensitive material with an exposure source through a pattern mask; and developing the photosensitive material to selectively remove portions of the photosensitive material along with the spacer particles thereon.

32. The method of claim 28, wherein the material comprises a non-photosensitive material.

33. The method of claim 28 wherein the spacer particles comprise a mean diameter to maintain a height of the cavity between the cap and substrate.

34. The method of claim 28 wherein selectively removing the spacer particles comprises:

depositing a photosensitive material on the inner surface of the substrate, covering the material with the spacer particles;

exposing the photosensitive material with an exposure source through a pattern mask;

developing the photosensitive material to selectively remove portions of the photosensitive material, leaving remaining portions;

removing the material and spacer particles unprotected by the remaining portions of the photosensitive material; and removing the remaining portions of the photosensitive material, leaving spacer particles selectively located on the inner surface.

* * * * *